US010359551B2

(12) United States Patent
Kuznetsov et al.

(10) Patent No.: US 10,359,551 B2
(45) Date of Patent: Jul. 23, 2019

(54) DIELECTRIC-ENHANCED METAL COATINGS FOR MEMS TUNABLE FILTERS

(71) Applicant: Axsun Technologies, Inc., Billerica, MA (US)

(72) Inventors: Mark E. Kuznetsov, Lexington, MA (US); Ranko Galeb, Burlington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 0 days.

(21) Appl. No.: 13/964,169

(22) Filed: Aug. 12, 2013

(65) Prior Publication Data

US 2015/0043002 A1 Feb. 12, 2015

(51) Int. Cl.
*G02B 26/02* (2006.01)
*G02B 5/28* (2006.01)
(Continued)

(52) U.S. Cl.
CPC .................. *G02B 5/28* (2013.01); *G01J 3/26* (2013.01); *G02B 26/001* (2013.01); *H01S 5/141* (2013.01);
(Continued)

(58) Field of Classification Search
CPC ...... G01J 3/26; G02B 6/29358; G02B 26/001
(Continued)

(56) References Cited

U.S. PATENT DOCUMENTS 6,373,632 B1 4/2002 Flanders et al.
6,594,059 B2 * 7/2003 Flanders ............... B81B 3/0035
359/224.1

(Continued)

OTHER PUBLICATIONS

Tourrenc, J.P. et al., "High Power Single-Longitudinal-Mode OP-VECSEL at 1.55 µm with Hybrid Metal-Metamorphic Bragg Mirror," Electronics Letters, vol. 43, No. 14, Jul. 5, 2007. Two pages.
(Continued)

*Primary Examiner* — Audrey Y Chang
(74) *Attorney, Agent, or Firm* — Houstonhogle LLP

(57) ABSTRACT

The present invention concerns the use of hybrid metal-dielectric optical coatings as the end reflectors of laser cavities and/or in the mirror structures used in other optical resonators, such as Fabry-Perot tunable filters, along with the use of such Fabry-Perot tunable filters in wavelength swept sources such as lasers. Hybrid metal-dielectric optical coatings have reflectivity spectra that can be broader than pure dielectric coatings, offer optical reflectivities higher than metal, as high as pure dielectric coatings, eliminate mirror transmission that can cause parasitic light reflections, and use fewer layers and thus have lower mass and higher mechanical resonant frequency for movable mirror applications An important characteristic of these coatings concerns the non-reflected light. Pure dielectric coatings offer high reflectivity, while the non-reflected portion of the light is transmitted by the coating to the substrate, for example. When metal is added to the optical coating, the non-reflected portion of the light is absorbed by the metal and is not transmitted to the substrate or outside the cavity. Hybrid metal-dielectric coatings have broader and more uniform spectral reflection. Tunable lasers with performance enhanced by the hybrid metal-dielectric coatings can be used in optical coherence tomography and spectroscopic analysis applications.

19 Claims, 5 Drawing Sheets

(51) Int. Cl.
*G02B 26/00* (2006.01)
*G01J 3/26* (2006.01)
*H01S 5/14* (2006.01)
*H01S 3/08* (2006.01)
*H01S 3/105* (2006.01)
*H01S 5/022* (2006.01)

(52) U.S. Cl.
CPC ........... *H01S 3/08059* (2013.01); *H01S 3/105* (2013.01); *H01S 5/0222* (2013.01); *H01S 5/02248* (2013.01); *H01S 5/02284* (2013.01)

(58) Field of Classification Search
USPC ........ 359/260, 578, 579, 288, 290; 356/506, 356/450, 454; 250/338.1
See application file for complete search history.

(56) References Cited

U.S. PATENT DOCUMENTS

| | | | |
|---|---|---|---|
| 6,608,711 B2 | 8/2003 | Flanders et al. | |
| 6,768,756 B2 | 7/2004 | Flanders et al. | |
| 7,106,514 B2* | 9/2006 | Murata | H01P 1/20381 359/578 |
| 7,415,049 B2 | 8/2008 | Flanders et al. | |
| 7,420,738 B2* | 9/2008 | Verghese | 359/578 |
| 7,697,192 B2* | 4/2010 | Wagner et al. | 359/288 |
| 7,968,846 B2* | 6/2011 | Talghader et al. | 250/338.1 |
| 8,319,169 B2* | 11/2012 | Funasaka | 250/216 |
| 8,405,899 B2* | 3/2013 | Chui | 359/290 |
| 8,512,492 B2* | 8/2013 | Yamazaki | 156/109 |
| 2004/0222418 A1* | 11/2004 | Mochizuki | G02B 26/02 257/59 |
| 2012/0127471 A1* | 5/2012 | Urushidani | G02B 26/001 356/450 |

OTHER PUBLICATIONS

Tourrenc, J.P. et al., "Thermal Optimization of 1.55 µm OP-VECSEL with Hybrid Metal-Metamorphic Mirror for Single-Mode High Power Operation," Optical and Quantum Electronics, Mar. 2008. Fourteen pages.

* cited by examiner

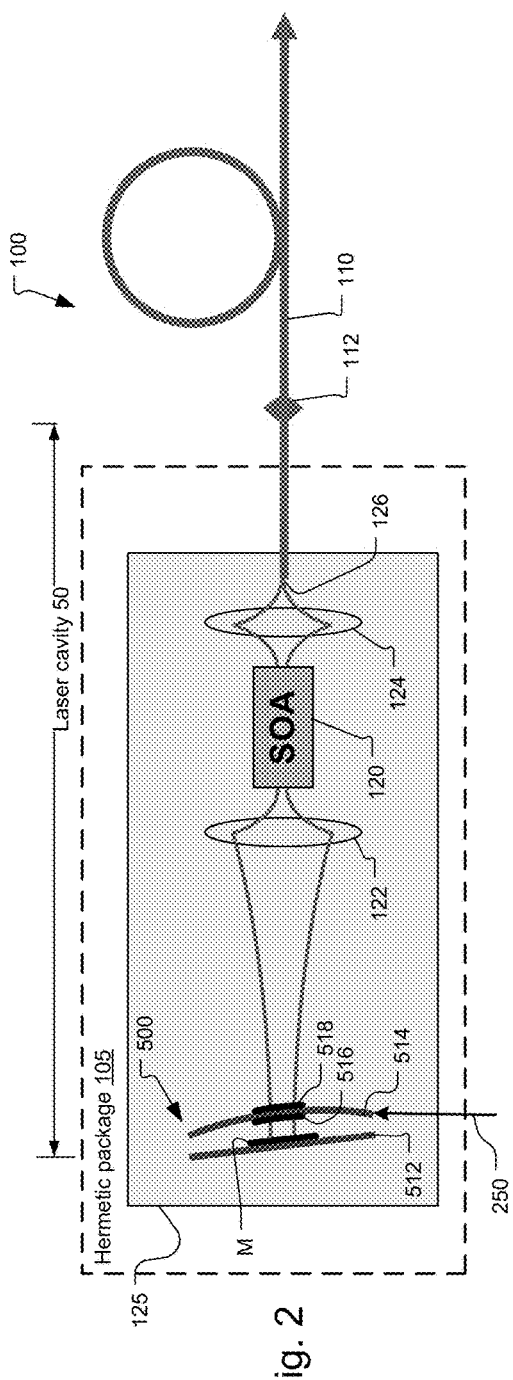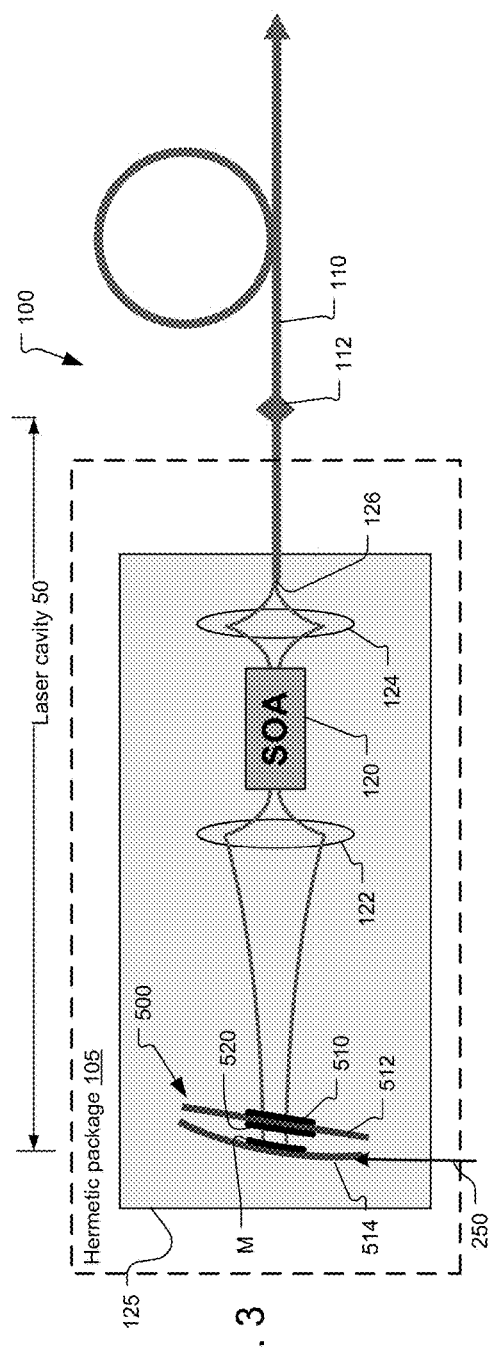

DIELECTRIC-ENHANCED METAL COATINGS FOR MEMS TUNABLE FILTERS

BACKGROUND OF THE INVENTION

Optical resonators often include two or more mirror structures that define the resonator cavity. Optical resonators can be passive cavity devices as, for example, tunable Fabry-Perot (FP) filters. Active cavity devices also include a gain medium, such as a semiconductor or a solid-state material, inside the cavity between the mirror structures. A laser is an active cavity optical resonator.

The earliest and simplest reflective optical mirror structures were made by applying a thin metal coating to a substrate. Typical metals for the coating are: gold (Au), silver (Ag), and aluminum (Al). Typical substrates include glass and silicon, for example. The advantage of metal mirrors is optical reflectivity over a very broad spectral range. The disadvantages are that the reflectivity is sometimes not high enough for high performance applications and the metal coatings are soft and can be damaged.

For high performance cavities, requiring highly reflective and/or low absorption mirror structures, multi-layer thin dielectric film coatings are preferred. The refractive index differences associated with certain material systems such as ceramics enable the formation of 10 or more layers to achieve a reflectivity greater than 97%. When the substrate is an optical membrane, such as found in micro-optical electromechanical systems (MOEMS), the coatings can be one-half or more of the thickness of the membrane. A disadvantage of such coatings is that reflectivity spectrum might not be broad and/or consistent enough for some applications.

Different cavity designs have been used for FP filters. A flat-flat Fabry-Perot cavity supports a continuum of plane wave transverse modes. In a confocal Fabry-Perot cavity, where cavity length is equal to the mirror radius of curvature, all transverse modes are degenerate, i.e., all the transverse modes coexist on the same frequencies, or wavelengths, as the longitudinal mode frequencies or the longitudinal mode frequencies shifted by a half spectral period. A more typical configuration for a MOEMS tunable Fabry-Perot cavity is termed a hemispherical cavity. In such cavities, one of the reflectors is near planar and the other reflector is a curved or spherical reflector. The advantage of this configuration is reduced alignment criticalities over a confocal cavity because of the general radial homogeneity of the flat reflector and reduced parallelism criticalities over the flat-flat cavity. In such hemispherical configurations, spatial mode spectral degeneracy is not present.

One type of MOEMS Fabry-Perot tunable filter utilizes an electrostatically deflectable membrane. Such MOEMS membranes are coated to be reflective and then paired with a stationary or fixed spacer mirror device to form a tunable FP cavity/filter. Hemispherical cavities are then created by forming an optically curved surface on either the membrane or the fixed spacer mirror device, the other surface then being substantially flat. A voltage is applied between the membrane and an adjacent structure. The FP optical cavity's separation distance changes through electrostatic attraction as a function of the applied voltage.

There are a few main components that typically make up a MOEMS membrane device. In one example, the MOEMS membrane device includes a handle wafer support structure or gain structure, such as in the case of a vertical cavity surface emitting laser (VCSEL). An optical membrane layer is added to the handle wafer support or gain structure; and a deflectable membrane structure is then fabricated in this layer. This MOEMS membrane device includes an insulating layer separating the wafer support or gain structure from the membrane layer. This insulating layer is partially or completely etched away or otherwise removed to produce the suspended membrane structure in a release process. The insulating layer thickness defines an electrical cavity across which electrical fields are established that are used to electrostatically deflect the membrane structure.

One application for MOEMS membrane devices is as the tunable element(s) of the swept sources used in Optical Coherence Tomography (OCT). Optical coherence analysis relies on the use of the interference phenomena between a reference wave and an experimental wave or between two parts of an experimental wave to measure distances and thicknesses, and calculate indices of refraction of a sample. OCT is one example technology that is used to perform high-resolution cross sectional imaging. It is often applied to imaging biological tissue structures, for example, on microscopic scales in real time. Optical waves are reflected from a sample or interfaces within the sample and a computer produces images of cross sections of the sample by using information on how the waves are changed upon reflection.

Fourier domain OCT (FD-OCT) currently offers the best performance for many applications. Moreover, of the Fourier domain approaches, swept-source OCT has distinct advantages over techniques such as spectrum-encoded OCT because it has the capability of balanced and polarization diversity detection. It has advantages as well for imaging in wavelength regions where inexpensive and fast detector arrays, which are typically required for spectrum-encoded FD-OCT, are not available.

In swept source OCT, the spectral components are not encoded by spatial separation, but they are encoded in time. The spectrum is either filtered or generated in successive frequency steps and reconstructed before Fourier-transformation. Using the frequency scanning swept source, the optical configuration becomes less complex but the critical performance characteristics now reside in the source and especially its frequency tuning speed and accuracy.

High speed frequency tuning for OCT swept sources is especially relevant to in vivo imaging where fast imaging reduces motion-induced artifacts and reduces the length of the patient procedure. It can also be used to improve resolution.

The swept sources for OCT systems have typically been tunable lasers. The advantages of tunable lasers include high spectral brightness and relatively simple optical designs. A tunable laser is constructed from a gain medium, such as a semiconductor optical amplifier (SOA) that is located within a resonant cavity, and a tunable frequency-selective element, such as a rotating grating, grating with a rotating mirror, or a Fabry-Perot tunable filter. Currently, some of the highest tuning speed lasers are based on the laser designs described in U.S. Pat. No. 7,415,049 B1, entitled Laser with Tilted Multi Spatial Mode Resonator Tuning Element, by D. Flanders, M. Kuznetsov and W. Atia, which is incorporated herein by the reference in its entirety. The use of MOEMS FP tunable filters combines the capability for wide spectral scan bands with the low mass, high mechanical resonant frequency deflectable MEMS membranes that have the capacity for high speed tuning. Specifically, in this design, the tunable laser uses a hemispherical cavity FP tunable filter that defines one end of the laser cavity.

Another field of application of tunable lasers, including those tuned with MOEMS movable membranes, is in spectroscopy. Tunable laser spectroscopy is used in many diverse areas, for example: gas detection and analysis, such as natural gas composition analysis; solid and liquid material identification and analysis, for example for different types of plastics, pharmaceuticals, or food products, to list a few examples.

SUMMARY OF THE INVENTION

In the design of optical resonators, it is often important to improve the reflectivity of the mirror structures. This is typically accomplished by increasing the number of thin dielectric film layers in the coatings of the mirror structures. This creates a problem in MOEMS FP tunable filters or other reflective structures, however. Increasing the number of layers increases the mass of the mirror structures. When these mirror structures are then located on small moving elements, i.e. the optical membranes, these moving elements can become harder to deflect or otherwise move due to their increased mass, which can reduce their high-speed performance by reducing the mechanical resonant frequency of these moving elements. In a MOEMS FP tunable filter used in tunable laser for a swept source OCT system, the result can be a reduction in the frequency tuning speed and/or accuracy.

Another problem that can arise in tunable lasers used in swept source OCT systems is stray reflections from components or interfaces within the lasers. Such reflections can be the result of stray light reflecting off optical elements, such as lenses, or mounting structures used to hold those optical elements. Another source of reflections can be from material interfaces in and near the laser cavity. Often these interfaces are antireflection (AR) coated. Yet, there still is some residual reflectivity that can create parasitic cavities that affect the tuning, spectral characteristics, and other performance metrics of the tunable lasers, such as undesired ghost images in the OCT system images.

A class of mirror coatings is termed hybrid metal-dielectric optical coatings. In such hybrid coatings, for example, a thin metal layer is deposited onto a substrate, followed by one or more dielectric layers. Reflectivity spectrum of hybrid metal-dielectric coatings can be broader than for pure dielectric coatings and offers optical reflectivities higher than metal, as high as pure dielectric coatings. An important characteristic of these coatings concerns the non-reflected light. Pure dielectric coatings offer high reflectivity while the non-reflected portion of the light is transmitted by the coating to the substrate, for example. When metal is added to the optical coating, the non-reflected portion of the light is absorbed by the metal and is not transmitted to the substrate or outside the cavity.

The present invention concerns the use of hybrid metal-dielectric optical coatings as the end reflectors of laser cavities and/or in the mirror structures used in other optical resonators, such as reflective Fabry-Perot tunable filters, along with the use of such Fabry-Perot tunable filters in swept sources such as lasers. Fabry-Perot filter where one of its two mirrors is a hybrid metal-dielectric mirror becomes a Gires-Tournois filter, as such filter has only reflected light and no transmitted light.

In general, according to one aspect, the invention features a tunable filter comprising an optical cavity defined by two mirrors, wherein one or both of the mirrors comprises dielectric layers arranged on a metal layer.

In embodiments, the dielectric layers comprise alternating layers of high refractive index material and low refractive index material, such as 6 or more layers. The dielectric layers can comprise tantalum pentoxide and silicon dioxide and the metal layer can comprise silver, gold, or aluminum.

The filter preferably comprises an electrostatically deflectable membrane supporting one of the mirrors, with the mirror on the electrostatically deflectable membrane comprising the dielectric layers arranged on the metal layer.

In general, according to another aspect, the invention features a method for fabricating a MEMS Fabry-Perot tunable filter comprising depositing a first dielectric mirror on a deflectable membrane device, depositing a second dielectric mirror on a fixed spacer substrate, and bonding the deflectable membrane device to the fixed spacer mirror device to create an optical cavity defined by the first mirror and the second mirror One or both of the first mirror and the second mirror comprises a metal layer under the dielectric mirror.

In general, according to still another aspect, the invention features a laser comprising a laser cavity, a gain medium in the laser cavity, and two mirrors defining the laser cavity. At least one of the mirrors comprises dielectric enhanced metal mirror comprising dielectric layers and a metal layer.

In embodiments, the gain medium is a semiconductor optical amplifier. A tunable filter can be included in which the dielectric enhanced metal mirror is one of the two mirrors of the tunable filter, such as an outermost one of the two filter mirrors, with respect to the laser cavity.

In general, according to still another aspect, the invention features an optical coherence analysis system comprising an interferometer that combines swept optical signal returning from a reference path and a sample to generate an interference signal, a detection system that detects the interference signal, and a tunable laser that generates the swept optical signal. The laser comprises a laser cavity, a gain medium in the laser cavity, and a tunable filter defining one end of the laser cavity and the tunable filter comprises an optical cavity defined by two mirrors, wherein both of the mirrors comprise dielectric layers and an outermost one of the two mirrors, with respect to the laser cavity, further comprises a metal layer under the dielectric layers.

In general, according to still another aspect, the invention features a tunable laser spectroscopic analysis system comprising an optical probe that delivers a tunable optical signal to the sample, a detection system that detects the tunable optical signal from the sample, and a tunable laser that generates the wavelength tunable optical signal. This laser comprises a laser cavity, a gain medium in the laser cavity, and a tunable filter, wherein the tunable filter comprises two mirrors, wherein one of the two mirrors comprises dielectric layers and a metal layer under the dielectric layers.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 2 is a more detailed schematic drawing of a tunable laser swept source having a tilted tunable filter tuning element according to a first embodiment the present invention;

FIG. 3 is a more detailed schematic drawing of a tunable laser swept source having a tilted tunable filter tuning element according to a second embodiment the present invention;

DETAILED DESCRIPTION OF THE PREFERRED EMBODIMENTS

Figure 1:
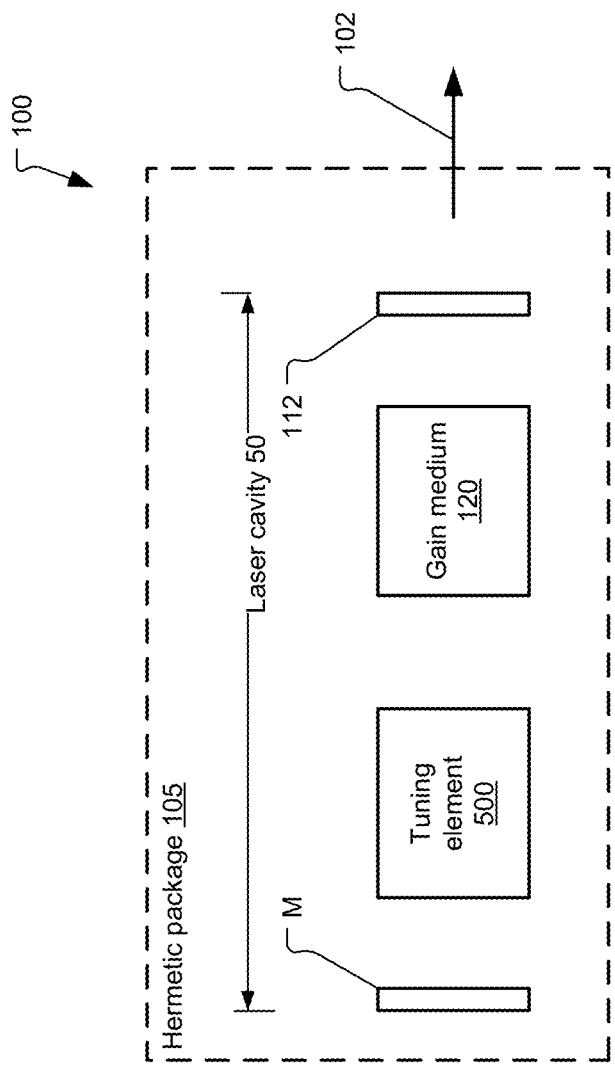
FIG. 1 is a general schematic drawing of a tunable laser swept source for optical coherence and/or spectral analysis according to the present invention.

FIG. 1 illustrates a general tunable laser configuration and the use of hybrid metal-dielectric optical coatings in the laser, according to the principles of the present invention.

The hybrid metal-dielectric optical coatings generally have two advantages. First, they prevent stray light within a hermetic package 105, for example, since light that might be transmitted through a standard dielectric optical coating will be absorbed by the hybrid metal-dielectric optical coatings. Secondly, hybrid metal-dielectric optical coatings tend to have broader reflectivity spectrums, which is helpful in tunable lasers with broad spectral scan bands, since the reflectivity of the end mirror M will be more consistent, and high, over the scan band.

In more detail, the tunable laser 100 includes a tuning element 500 and a gain medium 120 within an optical cavity 50 defined by an output mirror 112 and a back mirror M. According to a typical application of the present invention, the back mirror M will be constructed from the hybrid metal-dielectric optical coatings.

In operation, the gain medium 120, such as a semiconductor gain medium or a solid-state gain medium amplifies light within the laser cavity 50. The light resonates between the output optical mirror 112 and the back mirror M. The tunable element 500, such as a grating or FP filter, controls the gain spectrum of the laser 100 and thereby allows the selection and tuning of the lasing wavelength.

Generally, if an output mirror 112 is used, its reflectivity will be relatively low to allow the tunable signal 102 to exit from the cavity 50. Using a hybrid metal-dielectric optical coating for the output mirror 112 will generally be problematic, since the non-reflected light would be absorbed in that coating.

Transmitted light, however, is generally not desired for the back mirror M. Secondly, it should have a generally high reflectivity for most applications. Thus, the use of the hybrid metal-dielectric optical coatings here has advantages because of the broad reflectivity spectrum that is generally characteristic of such coatings coupled with the fact that non-reflected light is absorbed in the coating and therefore does not result in stray reflections back into the cavity or within the hermetic package 105.

In some examples, the laser 100 is a semiconductor laser that is fabricated by hybrid optical integration technologies. In other examples, the laser 100 uses a VCSEL configuration. In some of the VCSEL configurations, the tuning element 500 is a MOEMS membrane that is fabricated on the gain medium substrate and the mirrors M, 112 are deposited on or fabricated as layers in the gain medium substrate and/or tuning element membrane.

FIG. 2 shows a laser 100 that is typically fabricated using hybrid optical integration technologies and is further based on the design described in incorporated U.S. Pat. No. 7,415,049 B1.

In more detail with respect to this embodiment, the tunable laser 100 comprises a semiconductor gain chip 120 that is paired with a micro-optical electromechanical systems angled reflective tunable filter 500, which defines one end of the laser cavity. The cavity extends to a second, output reflector 112 that is located in a fiber pigtail 110 that is coupled to the bench 125 and also forms part of the cavity 50.

Currently, the length of the cavity in some applications is at least 40 millimeters (mm) long and preferably over 50 to 80 mm. This ensures close longitudinal mode spacing that reduces mode hopping noise. Currently, the reflective passband of the Fabry-Perot filter 500 is typically between 1 and 10 GHz.

In other embodiments, shorter cavities are used. In some specific implementations, very short cavities with wider passband tuning elements (filters) 500 are used for extremely high speed applications where only short coherence lengths are required. In some of these examples, the passband of the Fabry-Perot filter 500 is between 20 and 40 GHz, or wider.

The tunable or swept optical signal 102 passing through the output reflector 112 is transmitted on the optical fiber 110 or via free space to an interferometer of the OCT system, in current application. The output optical signal is ultimately delivered to the material being interrogated in the spectroscopic applications.

The semiconductor optical amplifier (SOA) chip gain element 120 is located within the laser cavity 50. In the current embodiment, input and output facets of the SOA chip 120 are angled and anti-reflection (AR) coated, providing, for example, parallel beams from the two facets. In the preferred embodiment, the SOA chip 120 is bonded or attached to the common bench 125 via a submount. Single angled facet (SAF) semiconductor gain chips can be used in other laser configurations.

The material system of the chip 120 is selected based on the desired spectral operating range. Common material systems are based on III-V semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlInGaAs, InGaAsP, AlGaAsSb, AlGaInAsSb, AlAsSb, InGaSb, InAsSb, and InGaAsSb. Collectively, these material systems support operating wavelengths from about 400 nanometers (nm) to 2000 nm, including longer wavelength ranges extending into multiple micrometer wavelengths. Semiconductor quantum well and quantum dot gain regions are typically used to obtain especially wide gain and spectral emission bandwidths. Currently, edge-emitting chips are used, although vertical cavity surface emitting laser (VCSEL) chips are used in different implementations.

The use of a semiconductor chip gain medium 120 has advantages in terms of system integration since semiconductor chips can be bonded to submounts that in turn are directly bonded to the bench 125. Other possible gain media can be used in other implementations, however. Such examples include solid state gain media, such as rare-earth (e.g., Yb, Er, Tm) doped bulk glass, waveguides or optical fiber.

Each facet of the SOA gain chip 120 has an associated lens structure 122, 124 that is used to couple the light exiting from either facet of the SOA 120. The first lens structure 122 couples the light between the back facet of the SOA 120 and the reflective tunable filter 500. Light exiting out the output or front facet of the SOA 120 is coupled by the second lens structure 124 to a fiber end facet 126 of the pigtail 110.

The angled reflective filter 500 is a multi-spatial-mode tunable filter that provides angular dependent reflective spectral response back into the laser cavity. This characteristic is discussed in more detail in incorporated U.S. Pat. No. 7,415,049 B1.

Preferably, the tunable filter 500 is a Fabry-Perot, or more specifically a Gires-Tournois, tunable filter that is fabricated using micro-electro-mechanical systems (MEMS) technology and is attached, such as directly solder bonded, to the bench 125. Currently, the filter 500 is manufactured as generally described in U.S. Pat. Nos. 6,608,711, 6,373,632, and 6,768,756, which are incorporated herein by this reference. A curved-flat or hemispherical resonator structure is used in which a generally flat mirror and an opposed curved mirror define a filter optical cavity, the optical length of which is modulated by electrostatic deflection of at least one of the mirrors.

The laser swept source 100 and the other embodiments discussed herein below are generally intended for high speed tuning to generate tunable optical signals that scan over the scanband at repetition rates greater than 1 kiloHertz (kHz). In current embodiments, the laser swept source 100 tunes at repetition rates greater than 50 or 100 kHz. In very high speed embodiments, the laser swept source 100 tunes at rates greater than 200 or 500 kHz.

The tuning drive signal 250 provides a tuning voltage function to the filter 500 that sweeps the passband optical frequency across the tuning band, preferably with optical frequency sweeping linearly with time. Typically, the width of the tuning band is greater than 10 nm. In the current embodiments, it is preferably between 50 and 150 nm, although even wider tuning bands are contemplated some examples.

The tuning speed of the laser 100 and thus the filter 500 during operation is also expressed in wavelength per unit time. In one example, for an approximately 110 nm tuning band or range or scan band and 100 kHz scan rate, assuming 60% duty cycle for substantially linear up-tuning, the peak sweep speed would be 110 nm*100 kHz/0.60=18,300 nm/msec=18.3 nm/μsec or faster. In another example, for an approximately 90 nm tuning range and 50 kHz scan rate, assuming a 50% duty cycle for substantially linear up-tuning, the peak sweep speed is 90 nm*50 kHz/0.50=9,000 nm/msec=9.0 nm/μsec or faster. In a smaller scan band example having an approximately 30 nm tuning range and 2 kHz scan rate, assuming a 80% duty cycle for substantially linear tuning, the peak sweep speed would be 30 nm*2 kHz/0.80=75 nm/msec=0.075 nm/μsec, or faster.

Thus, in terms of sweep speeds, in the preferred embodiments described herein, the sweep speeds of the laser 100 are greater than 0.05 nm/μsec, and preferably greater than 5 nm/μsec. In still higher speed applications, the sweep speeds are higher than 10 nm/μsec.

The bench 125 is termed a micro-optical bench and is preferably less than 10 millimeters (mm) in width and about 25 mm in length or less. This size enables the bench to be installed in a standard, or near standard-sized, butterfly or DIP (dual inline pin) hermetic package 105. In one implementation, the bench B is fabricated from aluminum nitride. A thermoelectric cooler is disposed between the bench 125 and the package 105 (attached/solder bonded both to the backside of the bench and inner bottom panel of the package) to control the temperature of the bench 125.

In the illustrated embodiment, the end mirror M is integrated as part of the FP filter 500. Specifically, in the illustrated embodiment, the mirror M, which is formed from a hybrid metal-dielectric optical coating, is deposited on the inner surface of a fixed spacer device 512. A standard dielectric coating is then deposited on the inner surface of a membrane 514 to thereby create the FP cavity of the FP tunable filter 500. The surface of the fixed spacer here can be either substantially flat or curved.

In order to facilitate the coupling of light into and out of the FP cavity of the tunable filter 500, an antireflective coating 518 is applied to the outer surface of the membrane 514. Such a reflective Fabry-Perot filter is also known as Giret-Tournois interferometer.

FIG. 3 illustrates an alternative embodiment of the swept laser source 100. In this embodiment, the orientation of the FP tunable filter 500 is reversed from that shown in the embodiment of FIG. 2.

Here, the hybrid metal-dielectric optical coating end mirror M is again integrated as part of the FP filter 500, but is deposited on the inner surface of the membrane 514. A standard dielectric coating is then deposited on the inner surface of the fixed spacer device 512 to thereby create the FP cavity of the FP tunable filter 500. The surface of the moving membrane here can be either substantially flat or curved.

In order to facilitate the coupling of light into and out of the FP cavity of the tunable filter 500, the antireflective coating 510 is deposited on the outer surface of the fixed spacer device 512.

Figure 4:
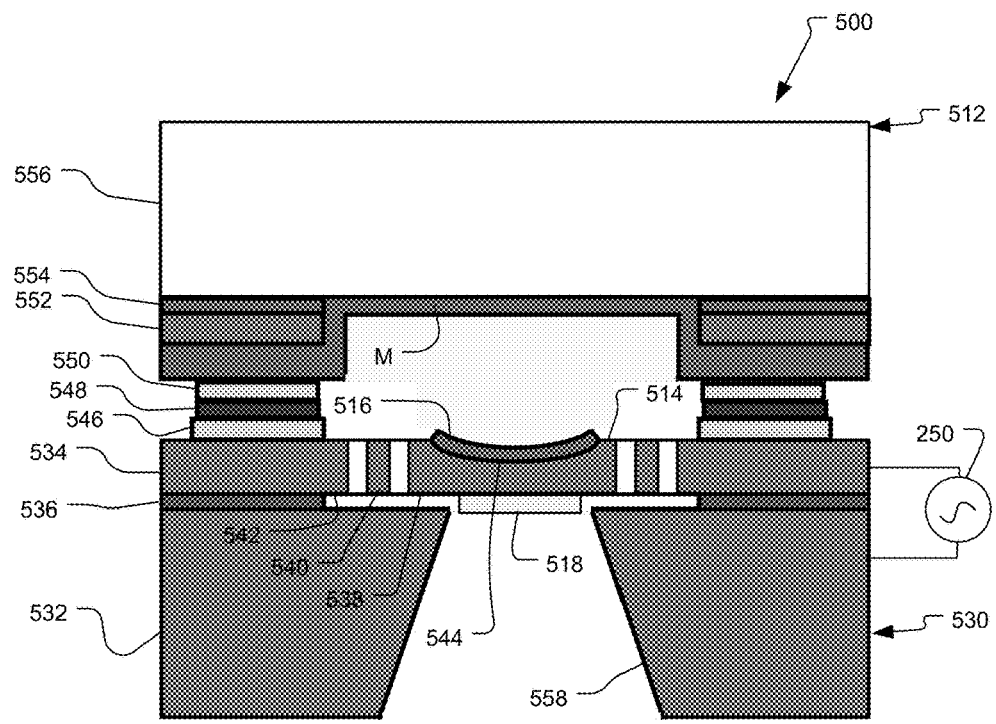
FIG. 4 is a schematic cross-sectional view of a tunable filter for use in the first embodiment tunable laser.

FIG. 4 shows a Fabry-Perot tunable filter 500 that is compatible with the embodiment of FIG. 2.

Generally, in the FP filter 500, the fixed spacer device 512 supports the hybrid metal-dielectric optical coating end mirror M. The opposed mirror 516 is located on the membrane device 530. The optical membrane 514 is part of the membrane device 530 to thereby define a Fabry-Perot (FP) cavity between mirrors 516 and M.

The optical membrane device 530 comprises handle material substrate 532 that functions, on the one hand, as a support. Also, electrical voltage applied between handle 532 and membrane 514 produces attractive force that displaces the membrane towards the handle. Preferably, the handle material is wafer material such as from a silicon wafer, which has been subsequently singulated into the illustrated device.

An optical membrane 514 is formed in device layer 534 that was added to the handle wafer material 532. The membrane structure 514 is formed in this optical membrane layer 534. In the current implementation, the membrane layer 534 is silicon. An insulating layer 536 separates the optical membrane layer 534 from the handle wafer material 532.

During manufacture, the insulating layer 536 functions as a sacrificial/release layer, which is partially removed to release the membrane structure 514 from the handle wafer material 532. Currently, the membrane layer 534 is manufactured from a silicon wafer that has been bonded to the insulating layer 536 under elevated heat and pressure.

In the current embodiment, the membrane 514 comprises a central body portion 538. The optical axis passes through the center of this body portion 538 and orthogonal to a plane defined by the membrane layer 534. A diameter of this body portion 538 is preferably 300 to 600 micrometers, although it can be smaller in other implementations.

Tethers 540 extend radially from the body portion 538 to an outer portion 542, which comprises the ring where the tethers 540 terminate. In the current embodiment, a spiral tether pattern is used.

According to the invention, for example, an optically curved surface 544 is disposed on the membrane structure 514. The dielectric mirror coating 516 is deposited on the membrane structure 514, specifically covering the optically curved surface 544. The dielectric mirror coating 516 is preferably a highly reflecting (HR) dielectric mirror stack, comprising 6 or more layers of alternating high and low index material. This yields a highly reflecting, but low absorption, structure.

In the illustrated embodiment, metal pads 546 are deposited on the proximal side of the membrane device 530. These are used to solder bond 548, for example, the fixed spacer device 512 onto the proximal face of the membrane device 530 via metal pads 550 on the spacer device 512.

The fixed spacer device 512 includes a spacer substrate 556 and a spacer cavity layer 552. An oxide etch stop layer 554 separates the spacer substrate 556 and the spacer cavity layer 552. During manufacture, the FP cavity is defined by removing the spacer cavity layer 552 to the depth of the oxide etch stop layer 554. The hybrid metal-dielectric optical coating end mirror M is then deposited onto the proximal side of the fixed spacer device 512.

During operation, the tuning signal 250 is applied as an electrostatic drive voltage between the membrane layer 534 and the handle material substrate 532 to pull the membrane 514 toward the handle material substrate 532 through electrostatic attraction.

The AR coating 518 is applied to the backside of the membrane 514 through an optical port 558 that is formed through the handle material substrate 532 to expose the backside of the membrane 514. Specifically, the optical port 558 has generally inward sloping sidewalls that end in the port opening. As a result, looking at the distal side of the handle material substrate 532, the membrane 514 is observed. The port is preferably concentric with the optical coating 516 and the optical surface 544.

Figure 5:
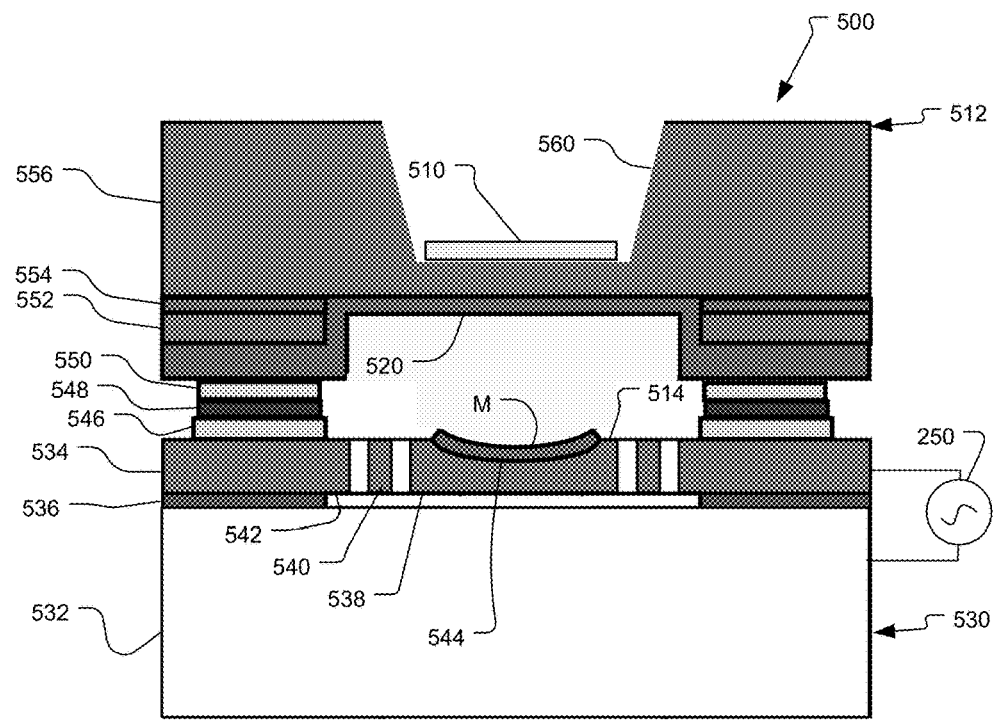
FIG. 5 is a schematic cross-sectional view of a tunable filter for use in the second embodiment tunable laser.

FIG. 5 shows a Fabry-Perot tunable filter 500 that is compatible with the embodiment of FIG. 3.

Here, in the FP filter 500, the membrane 514 supports the hybrid metal-dielectric optical coating end mirror M. A spacer optical port 560 formed into the fixed spacer device 512 is important here minimize the thickness of the material through which light must pass to enter the FP cavity. The AR coating 510 in the spacer optical port 560 reduces reflections and improves coupling into the cavity. The spacer surface can be either substantially flat or curved.

The AR coating 518 on the membrane 514 is preferably avoided to minimize membrane mass. The port 558 is preferably also not included in order to reduce manufacturing complexity and also improve the electrostatic force that can be applied to the membrane 514. The smaller diameter, or completely eliminated, port 558 here would not allow deposition of the AR coating 518 on the back side of the membrane. Such AR is not required in this filter configuration with the hybrid metal-dielectric HR coating M on the membrane, which blocks light transmission through the mirror M. In contrast, when the membrane mirror does transmit some light, as with pure dielectric coatings, AR coating on the back side of the membrane is required, as otherwise residual backside parasitic reflection would result in the detrimental spectral ripple of membrane mirror reflection.

In one example, the hybrid metal-dielectric optical coating end mirror M has metal deposited onto substrate, followed by 6 pairs of H/L layers, in which the top 4 layers are thickness optimized. Its center wavelength is 1308 nm. The metal layer is silver.

| Layer | Material | Extinction Coeff | Phase Thickness [deg] | Physical Thickness [nm] | Opt. |
|---|---|---|---|---|---|
| 1 | Ta2O5—B2 | 0.00000 | 178.275 | 305.46 | Yes |
| 2 | SiO2—B2 | 0.00000 | 89.492 | 224.73 | Yes |
| 3 | Ta2O5—B2 | 0.00000 | 134.366 | 230.23 | Yes |
| 4 | SiO2—B2 | 0.00000 | 33.161 | 83.27 | Yes |
| 5 | Ta2O5—B2 | 0.00000 | 90.000 | 154.21 | No |
| 6 | SiO2—B2 | 0.00000 | 90.000 | 226.01 | No |
| 7 | Ta2O5—B2 | 0.00000 | 90.000 | 154.21 | No |
| 8 | SiO2—B2 | 0.00000 | 90.000 | 226.01 | No |
| 9 | Ta2O5—B2 | 0.00000 | 90.000 | 154.21 | No |
| 10 | SiO2—B2 | 0.00000 | 90.000 | 226.01 | No |
| 11 | Ta2O5—B2 | 0.00000 | 90.000 | 154.21 | No |
| 12 | SiO2—B2 | 0.00000 | 90.000 | 226.01 | No |
| 13 | Argentum | 9.14974 | 5.742 | 99.97 | No |

Figure 6:
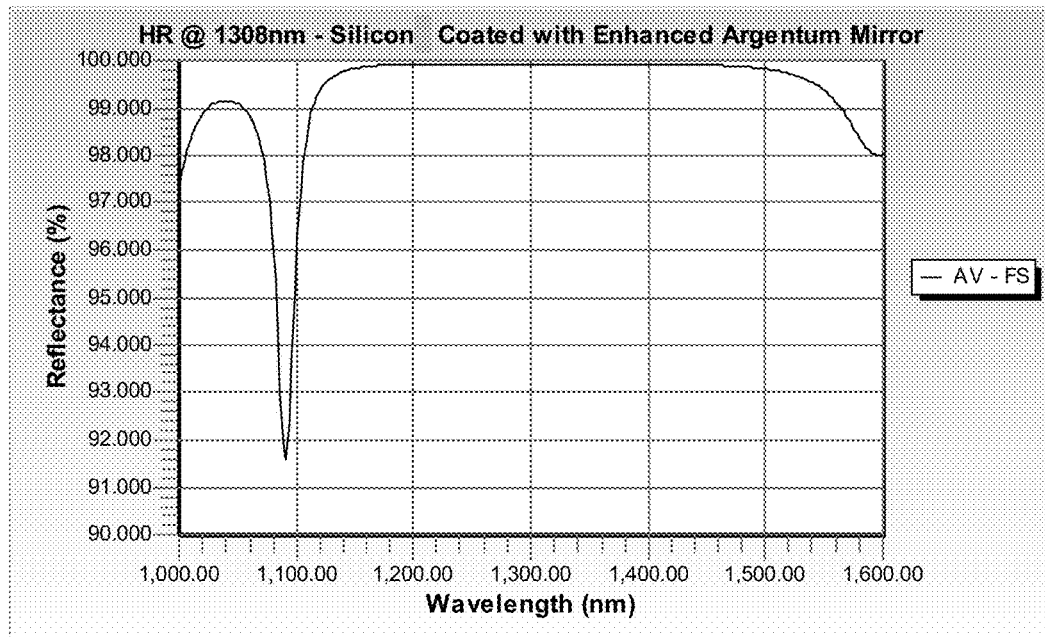
FIG. 6 is a plot of reflectance as a function of wavelength in nanometers (nm) for a first example of the hybrid metal-dielectric optical coating designed for a center wavelength of 1308 nm.

FIG. 6 is plot of the reflectance of the hybrid metal-dielectric optical coating end mirror M as a function of wavelength.

In another example, the hybrid metal-dielectric optical coating end mirror M has a metal layer followed by 8 pairs of H/L layers, in which the top 4 layers are thickness optimized. Its center wavelength is 1035 nm. The metal layer is silver.

| Layer | Material | Extinction Coeff | Phase Thickness [deg] | Physical Thickness [nm] | Opt. |
|---|---|---|---|---|---|
| 1 | Ta2O5—B2 | 0.00000 | 157.388 | 212.00 | Yes |
| 2 | SiO2—B2 | 0.00000 | 134.683 | 267.04 | Yes |
| 3 | Ta2O5—B2 | 0.00000 | 84.218 | 113.44 | Yes |
| 4 | SiO2—B2 | 0.00000 | 82.300 | 163.18 | Yes |
| 5 | Ta2O5—B2 | 0.00000 | 90.000 | 121.23 | No |
| 6 | SiO2—B2 | 0.00000 | 90.000 | 178.45 | No |
| 7 | Ta2O5—B2 | 0.00000 | 90.000 | 121.23 | No |
| 8 | SiO2—B2 | 0.00000 | 90.000 | 178.45 | No |
| 9 | Ta2O5—B2 | 0.00000 | 90.000 | 121.23 | No |
| 10 | SiO2—B2 | 0.00000 | 90.000 | 178.45 | No |
| 11 | Ta2O5—B2 | 0.00000 | 90.000 | 121.23 | No |
| 12 | SiO2—B2 | 0.00000 | 90.000 | 178.45 | No |
| 13 | Ta2O5—B2 | 0.00000 | 90.000 | 121.23 | No |
| 14 | SiO2—B2 | 0.00000 | 90.000 | 178.45 | No |
| 15 | Ta2O5—B2 | 0.00000 | 90.000 | 121.23 | No |
| 16 | SiO2—B2 | 0.00000 | 90.000 | 178.45 | No |
| 17 | Argentum | 7.00654 | 6.678 | 140.00 | No |

Figure 7:
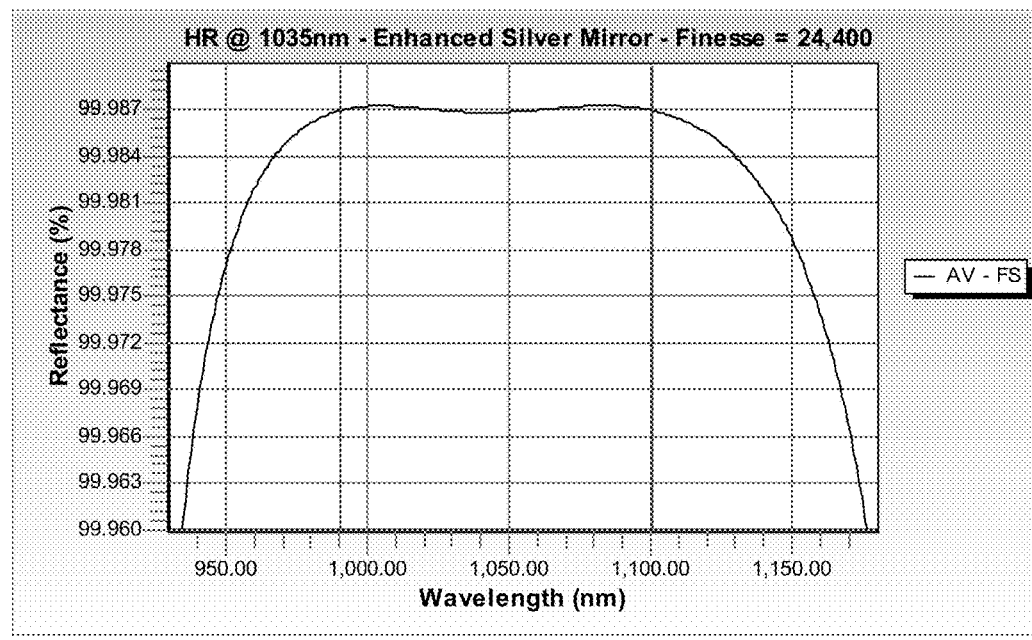
FIG. 7 is a plot of reflectance as a function of wavelength in nanometers for a second example of the hybrid metal-dielectric optical coating designed for a center wavelength of 1035 nm.

FIG. 7 is plot of the reflectance of the hybrid metal-dielectric optical coating end mirror M as a function of wavelength for this second example.

Hybrid metal-dielectric coatings reach high reflectivity levels with fewer layers than an equivalent reflectivity pure dielectric HR coating. Such thinner hybrid coatings thus also have a lower mass and as a result, when deposited onto a movable membrane, allow higher mechanical resonance frequency of the mirror-membrane structure. Such higher-resonance membranes allow higher scan rate membrane motion, as well as higher rate filter and laser tuning.

When one of the two mirrors of the Fabry-Perot filter uses a non-transmitting hybrid metal-dielectric mirror, this filter effectively becomes a reflective Giret-Tournois filter. In order to couple light into and out of such filter, the second mirror of this filter generally has to be partially transmitting, for example using a partially transmitting dielectric coating.

In summary, when the hybrid metal-dielectric optical coating end mirror M is used on the membrane, higher tuning rate is achieved with a lower mass of membrane and its coatings.

Further, the metal under the dielectric absorbs all the light transmitted through the mirror. Thus no anti-reflective AR coating is required on the substrate or membrane backside. This improves filter performance by complete elimination of residual reflection of imperfect AR coatings, which improves filter linewidth and reflectivity ripple, and the corresponding laser power pattern.

For filters 500 with back mirror on the fixed spacer device 512 (FIGS. 2 and 4), with AR coating not required, arbitrary thickness substrate can be used on the back mirror of the filter. Further, the optical port 560 is not required.

For filters 500 with the back mirror on the membrane 514 (FIGS. 3 and 5), with AR coating not required and no optical beam passing through the mirror back side, the optical port 558 can be made very small in transverse extent or possibly eliminated completely, when membrane release can be accomplished without the back port. Further, smaller area optical port allows for a larger area electrode to be used for electrostatic actuation of the membrane 514. Larger area electrode implies larger actuation forces and thus smaller required actuation voltage. Alternatively, larger actuation forces allow stiffer filter membrane with higher mechanical resonance frequency and higher membrane tuning rates, while keeping actuation voltage below maximum limit. As a result, higher tuning rate tunable filters are possible with actuation voltages within their allowed limits.

In general, the hybrid metal-dielectric coating has a wider spectral range, i.e. smaller variation of mirror reflectivity with wavelength. Such spectrally flat coating reduces filter linewidth variation upon wide-range wavelength tuning Reduced filter linewidth variation leads to better swept-frequency laser performance, such as improved laser tuning stability and longer dynamic laser coherence length. Further, to achieve the same high reflectivity, hybrid metal-dielectric coating is thinner, and thus lighter, than a pure dielectric coating. The lighter, lower mass, coating on a thin membrane increases its mechanical resonance frequency and allows faster filter tuning rate.

Tunable VCSEL laser configuration can also benefit from using hybrid metal-dielectric mirror, for example as the movable mirror of the laser cavity. Such mirror has a broader and more uniform spectral reflectivity and, for a movable mirror, lighter mass for higher rate tuning. When using metal-dielectric mirror, light output has to be taken elsewhere in the laser cavity.

Figure 8:
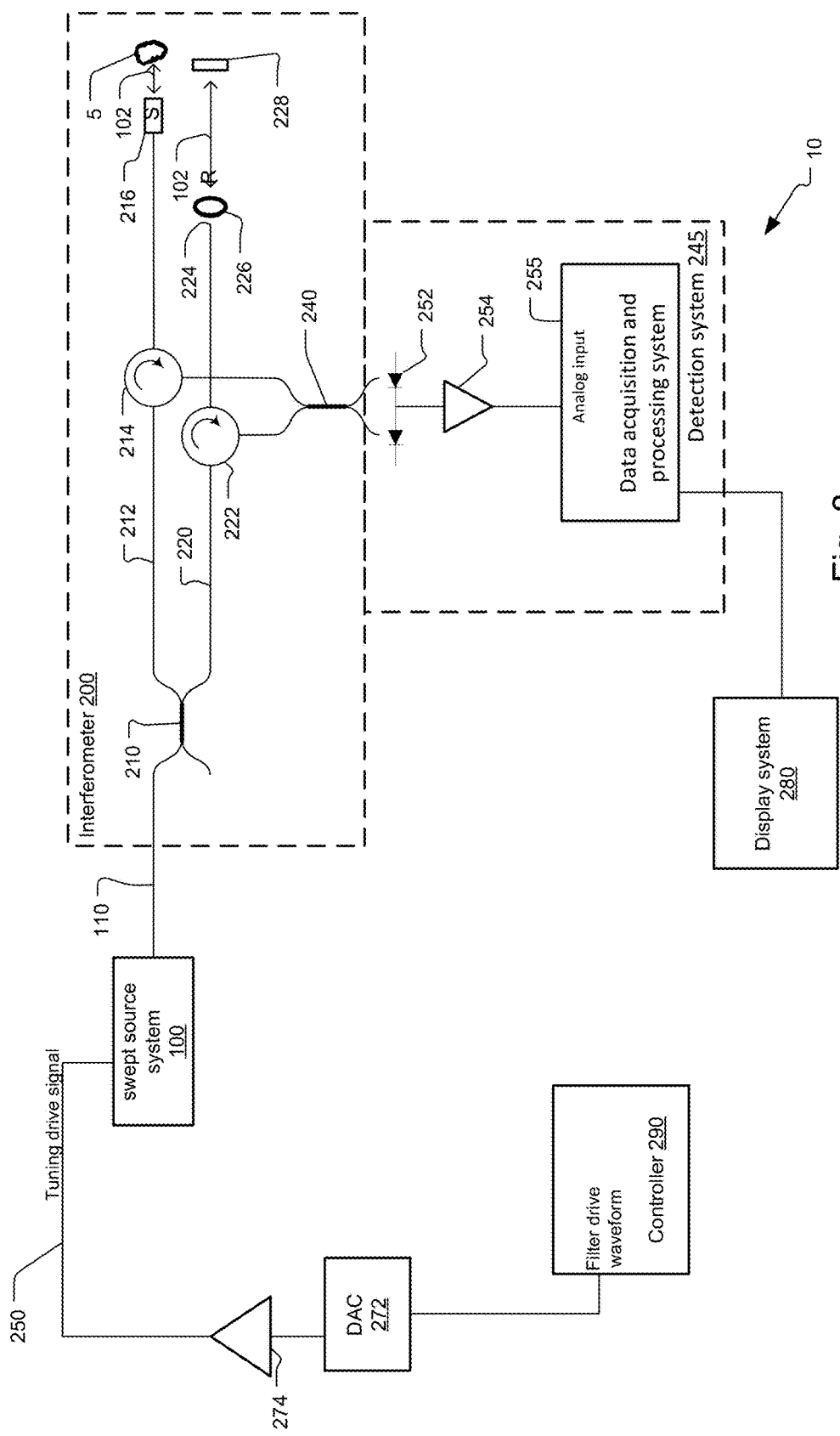
FIG. 8 is a schematic view of an OCT system incorporating the inventive laser swept source according to an embodiment of the invention.

FIG. 8 shows an optical coherence analysis system 10, such as a tomography system, using the swept laser source 100.

The optical swept laser source 100 generates the tunable or swept optical signal on optical fiber 110 that is transmitted to interferometer 200. The swept optical signal scans over a scan band with a narrowband emission.

Typically, the width of the tuning or scan band is greater than 10 nanometers (nm). In the current embodiments, it is preferably between 50 and 150 nm, although even wider tuning bands are contemplated in some examples. On the other hand, the bandwidth of the narrowband emission has a full width half maximum (FWHM) bandwidth of less than 20 or 10 GigaHertz (GHz), and is usually 5 GHz or less. For optical coherence tomography, this high spectral resolution implies a long coherence length and therefore enables imaging deeper into samples, for example deeper than 5 millimeters (mm). On the other hand, in lower performance applications, for example OCT imaging less than 1 mm deep into samples, broader FWHM passbands are sometimes appropriate, such as passbands of about 200 GHz or less.

A controller 290 generates a filter, or tunable element, drive waveform or waveform that is supplied to a digital to analog converter (DAC) 272. This generates a tunable element drive signal 250 that is amplified by amplifier 274 and applied to the FP tunable filter 500.

In the illustrated example, a Mach-Zehnder-type interferometer 200 is used to analyze the optical signals from the sample 5. The swept optical signal 102 from the optical swept laser 100 is transmitted on fiber 110 to a 90/10 optical fiber coupler 210 or other beam splitter. The swept optical signal is divided between a reference arm 220 and a sample arm 212 of the system 10.

The optical fiber, if used, of the reference arm 220 terminates at the fiber endface 224. The light 102R exiting from the reference arm fiber endface 224 is collimated by a lens 226 and then reflected by a reference mirror 228 to return back, in some exemplary implementations. A loop is used on other examples.

The fiber on the sample arm 212 terminates at the sample arm optical probe 216. The exiting swept optical signal 102S is focused by the probe 216 onto the sample 5. Light returning from the sample 5 is returned to a sample arm circulator 214 and directed to the interference signal combiner 240.

The reference arm signal and the sample arm signal are combined or mixed in the interference signal combiner 240 to generate an interference signal.

The interference signal is detected by a detection system 245. Specifically, a balanced receiver, comprising two detectors 252, is located at each of the outputs of the fiber coupler 240 in the illustrated embodiment. The electronic interference signal from the balanced receiver 252 is amplified by amplifier 254, such as a transimpedance amplifier.

In a related application, when the sample is being spectroscopically analyzed, the interferometer is not required. Instead, the tunable signal 102 transmitted to the sample and then detected. The spectroscopic response of the sample corresponds to the time-varying response of the detector(s) 252.

A data acquisition and processing system 255 of the detection system 245 is used to sample the interference signal output from the amplifier 254. A complete data set is collected of the sample 5 by spatially raster scanning the focused probe beam point over the sample 5 in a Cartesian geometry x-y fashion or a cylindrical geometry theta-z fashion. The spectral response at each one of these points is generated from the frequency tuning of the optical swept laser 100. Then, the data acquisition and processing system 255 performs a Fourier transform on the data in order to reconstruct the image and perform a 2D or 3D tomographic reconstruction of the sample 5. These transformed data are displayed by the display system 280.

In one application, the optical probe 216 is inserted into blood vessels and used to scan the inner walls of arteries and veins. In other examples, other analysis modalities are included in the probe such as intravascular ultrasound (IVUS), forward looking IVUS (FLIVUS), high-intensity focused ultrasound (HIFU), pressure sensing wires, and image guided therapeutic devices. In still other applications, the probe is used to scan different portions of an eye or tooth or other structure of a patient or animal.

While this invention has been particularly shown and described with references to preferred embodiments thereof, it will be understood by those skilled in the art that various changes in form and details may be made therein without departing from the scope of the invention encompassed by the appended claims.

What is claimed is:

1. A tunable filter, comprising:
   an optical cavity defined by two mirrors,
   wherein one of the mirrors comprises dielectric layers arranged on a metal layer, which are arranged on a substrate, and the other mirror comprises dielectric layers arranged on a deflectable membrane and an antireflection coating on a backside of the membrane with light being coupled into the optical cavity through said other mirror, and wherein the dielectric layers of both mirrors comprise alternating layers of high refractive index material and low refractive index material;
   wherein a reflective passband of the tunable filter is between 1 and 10 GHz wide; and
   wherein one of the mirrors is curved.

2. A tunable filter as claimed in claim 1, wherein the dielectric layers of both mirrors comprise 6 or more layers.

3. A tunable filter as claimed in claim 1, wherein the dielectric layers of both mirrors comprise 10 or more layers.

4. A tunable filter as claimed in claim 1, wherein the dielectric layers of both mirrors comprise tantalum pentoxide and silicon dioxide.

5. A tunable filter as claimed in claim 1, wherein the metal layer comprises silver, gold, or aluminum.

6. A tunable filter as claimed in claim 1, wherein the membrane is electrostatically deflectable.

7. A tunable filter as claimed in claim 1, further comprising a lens structure for coupling light into the optical cavity through said other mirror.

8. A tunable filter as claimed in claim 1, wherein the tunable filter is angled relative to an outer optical cavity.

9. A tunable filter as claimed in claim 1, wherein the tunable filter is solder bonded to an optical bench.

10. A tunable filter as claimed in claim 1, wherein the tunable filter is driven by a tuning drive signal that provides a tuning voltage function to the tunable filter that sweeps a passband optical frequency across a tuning band.

11. A tunable filter as claimed in claim 1, wherein the tunable filter is driven by a tuning drive signal that provides a tuning voltage function to the tunable filter that sweeps a passband optical frequency across a tuning band at repetition rates greater than 50 kHz.

12. A tunable filter as claimed in claim 1, further comprising a handle that functions as a support for the membrane, wherein an electrical voltage is applied between the handle and the deflectable membrane to displace the membrane toward the handle.

13. A tunable filter, comprising:
    an optical cavity defined by a first mirror and a second mirror,
    wherein the first mirror comprises dielectric layers arranged on a substrate, and the second mirror comprises dielectric layers on a metal layer, which are arranged on a deflectable membrane with light being coupled into the optical cavity through said first mirror, and wherein the dielectric layers of both mirrors comprise alternating layers of high refractive index material and low refractive index material;
    wherein a reflective passband of the tunable filter is between 1 and 10 GHz wide; and
    wherein one of the mirrors is curved.

14. A tunable filter as claimed in claim 13, further comprising a lens structure for coupling light into the optical cavity through said first mirror.

15. A tunable filter as claimed in claim 13, wherein the tunable filter is angled relative to an outer optical cavity.

16. A tunable filter as claimed in claim 13, wherein the tunable filter is solder bonded to an optical bench.

17. A tunable filter as claimed in claim 13, wherein the tunable filter is driven by a tuning drive signal that provides a tuning voltage function to the tunable filter that sweeps a passband optical frequency across a tuning band.

18. A tunable filter as claimed in claim 13, wherein the tunable filter is driven by a tuning drive signal that provides a tuning voltage function to the tunable filter that sweeps a passband optical frequency across a tuning band at repetition rates greater than 50 kHz.

19. A tunable filter as claimed in claim 13, wherein a spacer optical port is formed in the substrate to minimize a thickness of the substrate to light, and antireflection coating in the spacer optical port to reduce reflections of the light.

* * * * *